(12) United States Patent
Filippov et al.

(10) Patent No.: US 7,135,983 B2
(45) Date of Patent: Nov. 14, 2006

(54) OCCUPANT PRESENCE DETECTION DEVICE

(75) Inventors: Vladimir Filippov, Kitchener (CA); Kristopher Desrochers, Guelph (CA); Valeri Stepanov, Kitchener (CA); Otman Adam Basir, Kitchener (CA); Fakhreddine Karray, Waterloo (CA)

(73) Assignee: Intelligent Mechatronic Systems Inc. (CA)

( * ) Notice: Subject to any disclaimer, the term of this patent is extended or adjusted under 35 U.S.C. 154(b) by 129 days.

(21) Appl. No.: 10/319,431

(22) Filed: Dec. 13, 2002

(65) Prior Publication Data
US 2003/0122669 A1  Jul. 3, 2003

Related U.S. Application Data

(60) Provisional application No. 60/341,123, filed on Dec. 13, 2001.

(51) Int. Cl.
  *G08B 21/00* (2006.01)
(52) U.S. Cl. ............... 340/667; 340/666; 340/668; 340/602; 340/561; 340/438; 701/45; 701/46; 701/47
(58) Field of Classification Search ............... 340/667, 340/666, 668, 665, 652, 602, 457.1, 438, 340/561; 701/45, 46, 47
See application file for complete search history.

(56) References Cited

U.S. PATENT DOCUMENTS

| | | | |
|---|---|---|---|
| 3,732,538 A | 5/1973 | Gillund et al. | |
| 3,740,567 A | 6/1973 | Atkins | |

(Continued)

FOREIGN PATENT DOCUMENTS

DE  4417827 A1  11/1995

(Continued)

OTHER PUBLICATIONS

U.S. Appl. No. 10/643,159, "Capacitance Based Human Touch Activation and Switching Device", filed on Aug. 18, 2003.

(Continued)

*Primary Examiner*—Tai Nguyen
(74) *Attorney, Agent, or Firm*—Carlson, Gaskey & Olds

(57) ABSTRACT

The purpose of this invention is to sense the presence of a seated occupant in a vehicle such as an automobile, plane, train or bus, or in a room or location where it is desirable to detect if seats are occupied. The occupant presence detection device consists of a single seat-mounted electrode, an oscillator circuit, a bridge circuit, a detection circuit and a circuit for processing the detected signals. The oscillator circuit excites the electrode. If an occupant is present on the seat, additional capacitance from the human body is introduced into the bridge via the electrode. This created differences in the voltage and phase of the waveform in each arm of the bridge circuit which are amplified by a differential amplifier. The signal is then converted to a DC voltage that, when above a predetermined threshold, causes the device to outputs a signal that indicates the presence of an occupant. Using a bridge configuration and a differential amplifier allows the circuit to be operated over a wide range of supply voltages. It also reduces the need for high precision components and the need to regulate the amplitude of the waveform produced by the oscillator. The net result is a capacitive occupant sensing device that is less complex and less expensive that previous capacitive occupant sensing devices, yet is tolerant of power supply fluctuations, is able to function over a wide range of operating voltage and still provides failsafe functionality.

25 Claims, 6 Drawing Sheets

U.S. PATENT DOCUMENTS

| | | |
|---|---|---|
| 3,824,576 A | 7/1974 | Pioch |
| 3,898,472 A | 8/1975 | Long |
| 3,943,376 A | 3/1976 | Long |
| 4,157,539 A | 6/1979 | Hunts et al. |
| 4,300,116 A | 11/1981 | Stahovec |
| 4,621,258 A | 11/1986 | Campman |
| 4,656,456 A | 4/1987 | Evans |
| 4,796,013 A | 1/1989 | Yasuda et al. |
| 4,831,279 A | 5/1989 | Ingraham |
| 4,887,024 A | 12/1989 | Sugiyama et al. |
| 4,980,519 A | 12/1990 | Mathews |
| 5,036,321 A | 7/1991 | Leach et al. |
| 5,058,920 A | 10/1991 | Burger et al. |
| 5,130,672 A | 7/1992 | Watkiss et al. |
| 5,166,679 A | 11/1992 | Vranish et al. |
| 5,214,388 A | 5/1993 | Vranish et al. |
| 5,247,261 A | 9/1993 | Gershenfeld |
| 5,380,983 A | 1/1995 | Cavada et al. |
| 5,404,128 A | 4/1995 | Ogino et al. |
| 5,410,297 A | 4/1995 | Joseph et al. |
| 5,411,289 A | 5/1995 | Smith et al. |
| 5,413,378 A | 5/1995 | Steffens, Jr. et al. |
| 5,467,022 A | 11/1995 | Aoki et al. |
| 5,525,843 A | 6/1996 | Howing |
| 5,554,973 A | 9/1996 | Kawashima et al. |
| 5,602,734 A | 2/1997 | Kithil |
| 5,624,132 A | 4/1997 | Blackburn et al. |
| 5,657,012 A | 8/1997 | Tait |
| 5,722,686 A | 3/1998 | Blackburn et al. |
| 5,724,024 A | 3/1998 | Sonderegger et al. |
| 5,732,375 A | 3/1998 | Cashler |
| 5,770,997 A | 6/1998 | Kleinberg et al. |
| 5,789,827 A | 8/1998 | Rowley et al. |
| 5,796,355 A | 8/1998 | Smigelski |
| 5,802,479 A | 9/1998 | Kithil et al. |
| 5,864,295 A | 1/1999 | Jarocha |
| 5,878,620 A | 3/1999 | Gilbert et al. |
| 5,917,165 A | 6/1999 | Platt et al. |
| 5,942,815 A | 8/1999 | Neuman et al. |
| 5,942,975 A | 8/1999 | Sorensen |
| 6,051,981 A | 4/2000 | Greshenfield et al. |
| 6,161,070 A | 12/2000 | Jinno et al. |
| 6,218,632 B1 | 4/2001 | McCarthy et al. |
| 6,225,710 B1 | 5/2001 | Palata et al. |
| 6,260,879 B1 | 7/2001 | Stanley |
| 6,283,504 B1 | 9/2001 | Stanley et al. |
| 6,292,727 B1 | 9/2001 | Norton |
| 6,307,182 B1 | 10/2001 | Lile |
| 6,356,194 B1 * | 3/2002 | Fukui et al. ................ 340/561 |
| 6,392,542 B1 | 5/2002 | Stanley |
| 6,429,782 B1 | 8/2002 | Pavatich et al. |
| 6,480,183 B1 | 11/2002 | Van Ruymbeke et al. |
| 6,703,845 B1 * | 3/2004 | Stanley et al. ............. 324/663 |
| 6,816,077 B1 * | 11/2004 | Shieh et al. ................ 340/602 |
| 6,831,565 B1 * | 12/2004 | Wanami et al. ............ 340/667 |
| 2001/0045733 A1 | 11/2001 | Stanley et al. |

FOREIGN PATENT DOCUMENTS

| | | |
|---|---|---|
| DE | 195 47 842 A1 | 6/1997 |
| DE | 197 24 168 C1 | 8/1998 |
| EP | 1 198 063 A1 | 4/2002 |
| GB | 2 343 043 A | 4/2000 |
| WO | WO 00/11443 | 3/2000 |
| WO | PCT/IB02/05378 | 12/2002 |

OTHER PUBLICATIONS

Communication pursuant to Article 96(2) EPC, Nov. 10, 2005.

* cited by examiner

OCCUPANT PRESENCE DETECTION DEVICE

This application claims priority to U.S. Provisional Patent Application Ser. No. 60/341,123, filed Dec. 13, 2001.

BACKGROUND OF THE INVENTION

The present invention relates to safety systems and more particularly to capacitive occupancy detection devices. Occupant detection devices can be used to enable or disable a safety restraint device, such as an airbag, or to determine how many occupants are present in a vehicle or a room. These devices can be used to detect the absence of an occupant in the passenger seat of a vehicle, and thereby disable the deployment of the passenger's airbag. The number of occupants in a vehicle may also be monitored prior to an accident in order to provide a telematic unit, such as Onstar®, with an occupant count in order to dispatch an adequate amount of emergency response. Having an accurate occupant count prior to an accident can also help emergency response personnel to determine if one or several of the occupants may have been ejected from the vehicle during the collision. In the transportation industry, occupant presence detection devices can provide a quickly count of the number of passengers in a plane, train or bus. They can also show which seats are occupied and which are not. This can also apply to theaters or halls where it is desirable to know how many occupants are present and where newly arriving customers can find empty seats.

Various technologies have been proposed to sense the presence of an occupant in a vehicle. Early detection apparatus utilized one or more mechanical switches, which are actuated by the weight of the body upon the seat. Some systems use infrared or ultrasonic transmitters and receivers, which generate signals that are reflected off of the occupant and then received and processed. Capacitive sensors have also been used as a means of detecting the presence of an occupant.

Other capacitance-based systems exist that consist of only one electrode mounted between the seat foam and the seat coverings. These systems also rely on the occupant adding capacitance to the system, and thus causing a change in the voltage, current, or phase of the oscillator signal, which can be detected. However, many of these devices, which claim to be inexpensive, use circuitry that is far more complex than the circuitry of the device described herein. Some or these devices, such as the device described in U.S. Pat. No. 6,161,070, require precision power supplies and amplitude control of the waveform generated by their oscillators. They may require precision components and may only function over a small range of supply voltages. In addition, in order to provide better noise rejection, these devices must have additional circuitry to filter out noise. This adds a great deal of cost and complexity to these devices in comparison with this invention.

Furthermore, some devices, such as the device described in U.S. Pat. No. 4,796,013, cannot accurately detect whether the electrode is disconnected or damaged and will determine this situation to be an empty seat regardless of whether an occupant is present or not. This is because a disconnected electrode reduces the capacitance of the system and a capacitance below a certain threshold is assumed to mean an empty seat. This could prove to be fatal when the device is being used to provide logic that enables or disable a safety restraint device, such as an airbag.

SUMMARY OF THE INVENTION

The purpose of the present invention is to provide an occupant detection device, which avoids the use of mechanical sensing apparatuses, and is less expensive and more reliable than existing capacitive based occupant sensing systems. The present invention includes a single conductive electrode which, in conjunction with its surroundings, forms a capacitor which is a part of a bridge circuit. The device includes an oscillator for continuous excitation of the bridge, a differential amplifier to determine if the bridge is unbalanced, an AC-DC converter circuit to convert the output of the amplifier to a DC signal, and a threshold circuit for triggering the output signal once the output of the AC-DC converter exceeds a predetermined threshold.

One arm of the bridge circuit is used as a reference for the arm of the bridge that contains the electrode. Each arm of the bridge is essentially a low-pass filter. The reference arm of the bridge is tuned to have the same filter characteristics as the arm that contains the electrode. The change in attenuation and phase of the waveform passing through the electrode arm of the bridge is measured with respect to the reference arm of the bridge. Since both arms of the bridge are receiving the same waveform, it does not matter if the amplitude varies slightly.

If an occupant is present on the seat, additional capacitance from the human body is introduced into the bridge via the electrode. This creates differences in the voltage and phase of the waveform in each arm of the bridge circuit. These changes are then amplified by a differential amplifier. The signal is then converted to a DC voltage that, when above a predetermined threshold, causes the device to output a signal that indicates the presence of an occupant. Using a bridge configuration and a differential amplifier allows the circuit to be operated over a wide range of supply voltages. It also reduces the need for high precision components and the need to regulate the amplitude of the waveform produced by the oscillator.

BRIEF DESCRIPTION OF THE DRAWINGS

Other advantages of the present invention will be readily appreciated as the same becomes better understood by reference to the following detailed description when considered in connection with the accompanying drawings wherein:

FIG. 6a shows the TOP and SIDE view of the electrode. FIG. 6b shows the block diagram of the basic detection circuit.

DESCRIPTION OF THE PREFERRED EMBODIMENT

Figure 1:
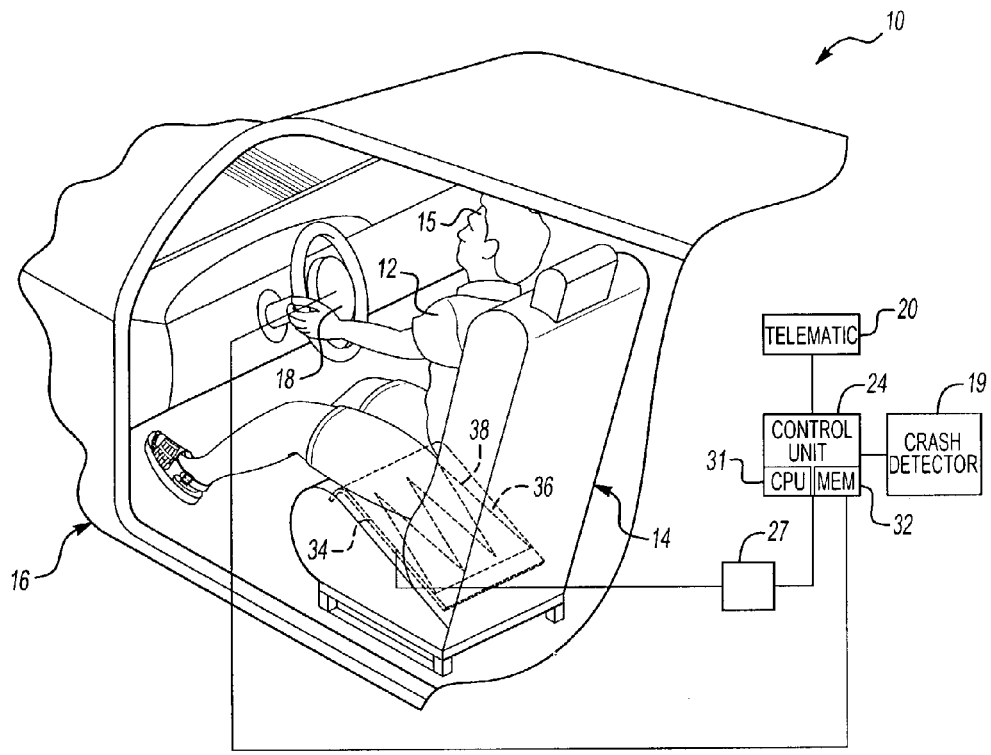
FIG. 1 illustrates an occupant detection system according to the present invention, as installed in a vehicle.

FIG. 1 illustrates an occupant presence detection system 10 for determining the presence of an occupant 12 in a vehicle seat 14. For illustrative purposes, the occupant presence detection system 10 of the present invention will be described as it is used in a vehicle seat 14 installed in a vehicle passenger compartment 16 in conjunction with an occupant safety system including an automatic safety restraint, such as an airbag 18; however, the occupant presence detection system 10 could be used in other applications to determine the presence of an occupant. Although a steering wheel mounted airbag 18 is illustrated as an example, it should also be understood that the present invention is also useful for side airbags, seatbelt pre-tensioners, deployable knee bolsters, and any other automatic safety restraint actuators. A crash detector 19, such as a crash sensor of any known type, is used to determine the occurrence of a vehicle crash and to determine the crash severity. A telematic unit 20 of the type described above may also be provided.

The system 10 includes a control unit 24 generally comprising a CPU 31 having memory 32. The CPU 31 is suitably programmed to perform the functions described herein and a person of ordinary skill in the art could program the CPU 31 accordingly and supply any additional hardware not shown but needed to implement the present invention based upon the description herein. In operation, the control unit 24 communicates with the crash detector 19 to determine the occurrence and severity of a crash of the vehicle and activates an appropriate safety system, such as air bag 18, in response.

The present invention provides a detector circuit 27 to determine the presence of the occupant 12 in the vehicle seat 14 and communicate the presence or absence of the occupant 12 in the seat 14. As will be described in more detail, the detector circuit 27 generally includes a seat electrode 34 mounted adjacent the area to be occupied by the occupant 12, in this case in the vehicle seat 14. The seat electrode 34 comprises a sheet of non-conductive fabric 36 with a pattern sewn on using special conductive thread 38, such as Dupont Aracona. The electrode 34 can be made of any conductive material and can be of any size or shape. It does not have to form the same pattern as the conductive thread 38 shown and it could be made from a continuous sheet of conductive material; however, conductive thread 38 is preferred since it can be sewn directly into the non-conductive fabric 36, which could be the seat 14 cover, or a layer of material below the seat cover. Although a crown-shaped pattern for the thread 38 is shown in FIG. 1, the pattern of the thread 38 does not have to be the same as the crown shaped pattern depicted in FIG. 1. The detection circuit can be tuned for any pattern that covers the desired sensing area. The larger the area covered by the electrode, the more sensitive it will be for all occupant seating positions. Although only one detector circuit 27 is shown, it is preferred that a detector circuit 27, or at least a different seat electrode 34, would be provided for each available seat in the vehicle. Alternatively, the electrode 34 could be solid, flat electrode instead of the conductive thread 38.

Figure 2:
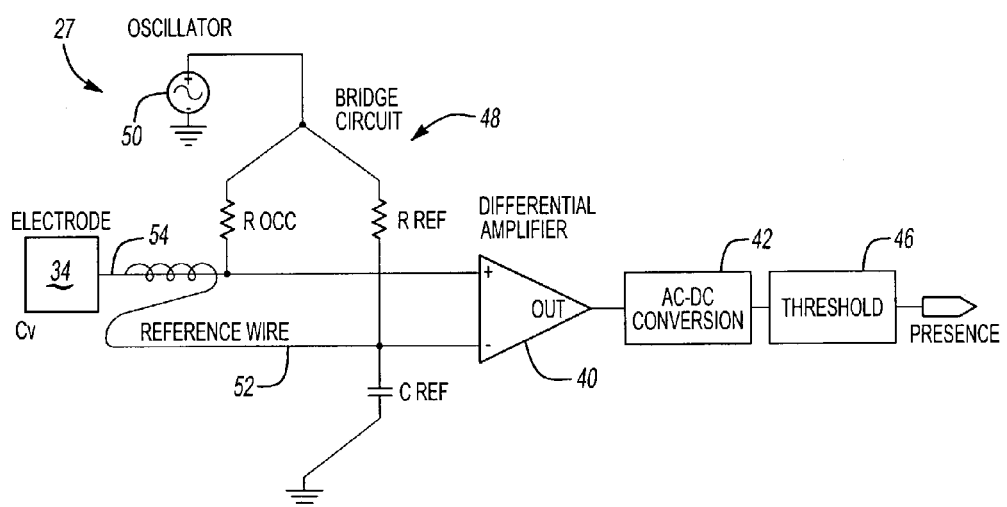
FIG. 2 shows the block diagram of the basic detection circuit.

This invention uses the detection circuit 27, shown in FIG. 2, which can use a single differential amplifier 40 and AC-DC conversion circuit 42 to detect changes in the voltage, current and phase of the waveform produce by the oscillator 44. A single threshold circuit 46 determines if these changes indicate the presence of an occupant. The two inputs to the differential amplifier 40 are each connected to one of a pair of arms in a bridge circuit 48. One arm of the bridge circuit 48 is used as a reference arm, including $R_{ref}$, $C_{ref}$ and reference wire 52. The other arm of the bridge circuit 48 contains the electrode 34 and $R_{occ}$. An oscillator 50 is connected to both arms. Each arm of the bridge circuit 48 is essentially a low-pass filter. The reference arm of the bridge circuit 48 is tuned to have the same filter characteristics as the arm that contains the electrode 34. The change in attenuation and phase of the waveform passing through the electrode arm of the bridge circuit 48 is measured with respect to the reference arm of the bridge circuit 48. Since both arms of the bridge circuit 48 are receiving the same waveform, it does not matter if the amplitude varies slightly.

Noise rejection is accomplished by providing a second wire 52 that is connected to the reference arm of the bridge circuit 48 and twisted together with a wire 54 that connects the electrode 34 to the bridge circuit 48. Since both wires 52, 54 pick up the same noise, the noise is not amplified because it is common to both arms of the bridge circuit 48 and both inputs to the differential amplifier 40. All thresholds and signals in the device vary in proportion to the power supply voltage. As such, the device is tolerant to sudden changes in the supply voltage and will function over a wide range of supply voltages. Wire 54 may also be a coaxial cable in order to avoid noise and interference problems.

The virtual capacitor $C_v$, created by electrode 34 is connected in series with the resistor $R_{occ}$ to form one arm of the bridge circuit 48. These are connected in parallel with the resistor $R_{ref}$ and the capacitor $C_{ref}$ which form the reference arm of the bridge circuit 48. Each arm of the bridge circuit 48 is essentially a low pass filter. The product RC determines the characteristic of each low pass filter. When RC changes, the phase and the amplitude of output of the filter changes. The RC value for the reference low pass filter is chosen so the bridge circuit 48 is balanced when the seat is empty. When there is an occupant present in the seat, $C_v$ increases and the RC value changes in only one arm of the bridge circuit 48. The outputs of the two low pass filters are no longer the same. The unbalance in the bridge circuit 48 is detected by amplifying the differences between the two signals. The amplified signal is an AC signal representing the voltage difference between the two filters multiplied by the gain of the amplifier. The difference in phase shifts between the two filters are detected because the leading and lagging portion of each waveform overlap each other causing a voltage differences between theses signals. The AC signal is then passed through the AC-DC conversion circuit 42 to produce a DC signal that is then compared to a predetermined threshold in threshold detection circuit 46 to determine if an occupant is present or if a failure has occurred that causes the output to default to occupant present.

Both an increase and decrease in capacitance can cause a debalance in the bridge circuit 48. An increase in capacitance indicates the presence of an occupant, while a decrease in capacitance indicates a disconnected or damaged electrode 34. Both situations will cause the output to indicate "occupied." This means that if the electrode 34 is damaged, the device will fail in a safe mode that will allow the safety restraints system to revert to a first generation configuration where the safety restraints device is always deployed in the event of a serious accident. However, other embodiments of the invention described below provide detection of these faults allowing for alternative measures to be taken in the event of a device failure.

Figure 2A:
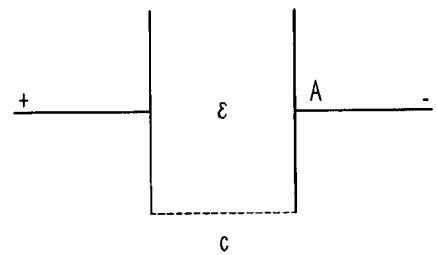
FIG. 2a shows the basic model for a capacitor.

FIG. 2a shows the basic model of a capacitor. The formula for a parallel capacitor is, $C = \in A/d$, where C is capacitance, $\in$ is the permittivity, A is area of the plates and d is the distance between the plates. The values of these variables determine the capacitance of the capacitor. Therefore, a change in one or more of these variables causes a change in capacitance. The permittivity and the area of the plates are proportional to the capacitance while the distance between the plates is inversely proportional to the capacitance. This means that an increase in permittivity or area causes an increase in capacitance while a decrease in permittivity or area causes a decrease in capacitance. The opposite is true for the distance between the plates. An increase in the distance between the plates causes a decrease in capacitance while a decrease in the distance between the plates causes an increase in capacitance. The electrode acts as one plate, while the surrounding environment acts as the second plate.

Figure 2B:
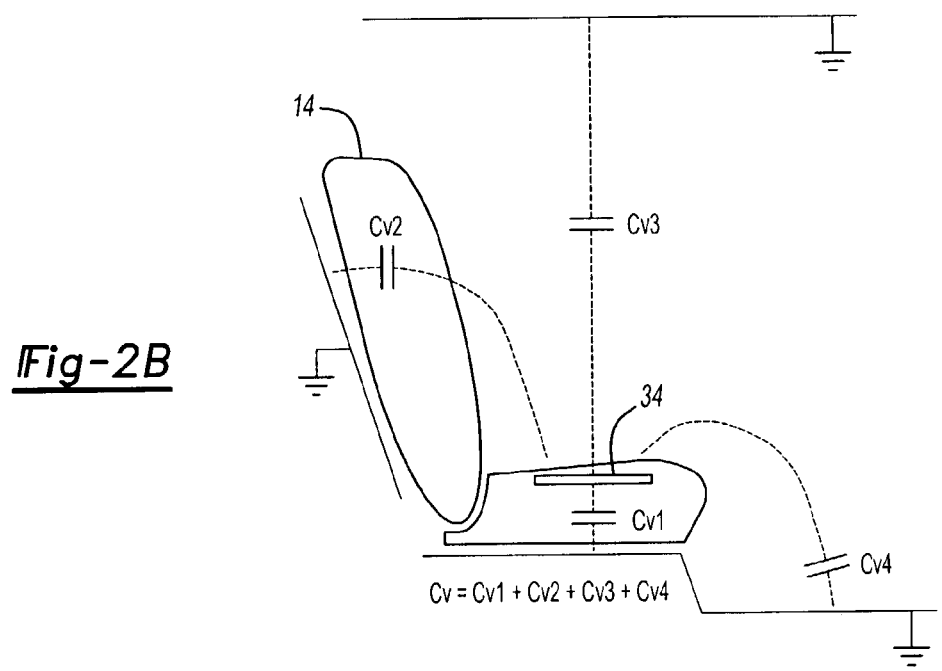
FIG. 2b shows the sources of capacitance when the seat is empty.

FIG. 2b shows a model of the sources of capacitance in a typical vehicle. The value $C_v$ is the sum of virtual capacitors formed between the electrode 34 and the portion of the chassis beneath the seat ($C_{v1}$), the seat frame ($C_{v2}$), the roof ($C_{v3}$) and the floor pan ($C_{v4}$). However, the invention does not require a grounded frame to function, any type of structure including walls, ceilings, floors and the earth beneath one's feet can act as the second plate of the capacitor. The capacitance of the virtual capacitor $C_v$ changes depending on the medium between the electrode 34 and its surroundings.

Figure 2C:
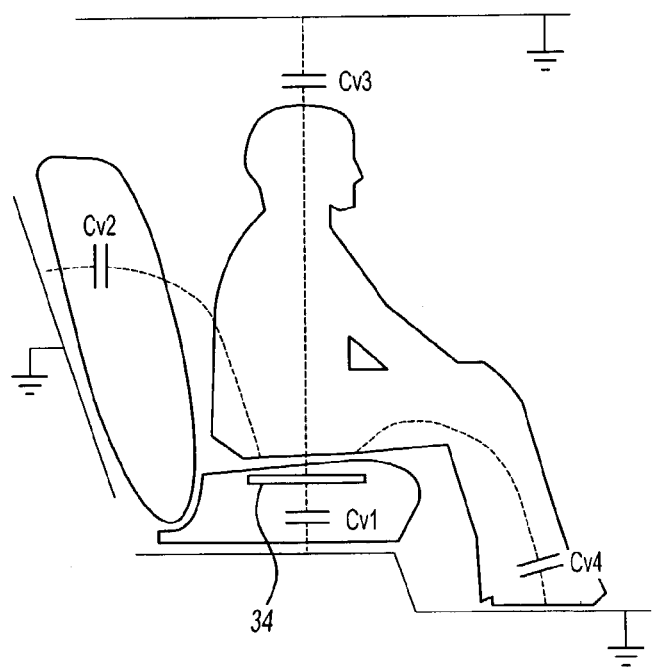
FIG. 2c shows the sources of capacitance when the seat is occupied.

FIG. 2c shows the same model with an occupant present. Assuming that we have a capacitor with constant area and distance between the plates, then the capacitance will be altered by the medium put between the plates. When the seat is empty the medium adjacent the electrode 34 is air. Water has a higher permittivity than air and the seat foam and the human body consists of approximately 65% water. Hence, putting a human body between the electrodes and its surroundings will increase the permittivity and, in turn, will increase the capacitance between the electrode and its surroundings ($C_{v2}$, $C_{v3}$, $C_{v4}$). The weight of the body will also cause the distance between the electrode and the portion or the chassis beneath the seat to decrease, causing an increase in the capacitance $C_{v3}$. Therefore, the capacitance of an occupied seat ($C'_v$) will be larger than the capacitance of an empty seat ($C_v$).

Figure 3:
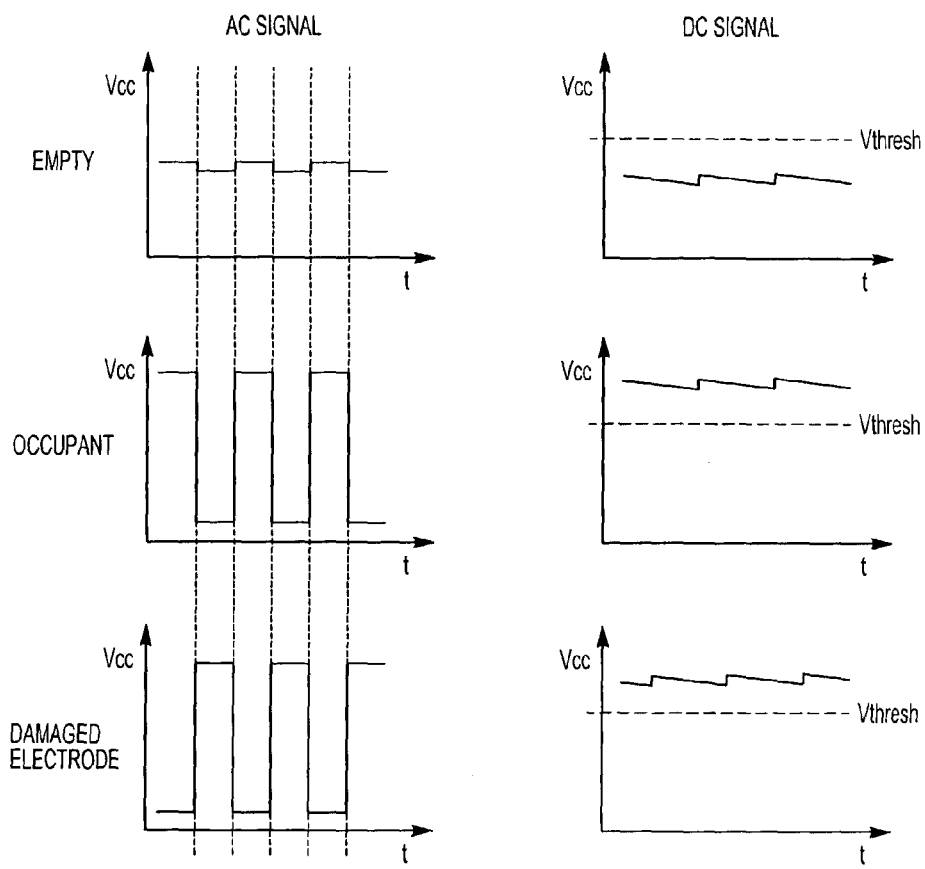
FIG. 3 shows the output of the differential amplifier before and after the AC-DC conversion when the seat is empty, occupied and when the electrode is disconnected or damaged.

FIG. 3 shows the output of the differential amplifier 40 (FIG. 2) before and after AC-DC conversion by AC-DC converter 42 (FIG. 2). When the seat 14 is empty, the difference between the outputs of the two low pass filters will be small and the output of the differential amplifier will be almost flat and will be centered around half-supply. Once it is converted to a DC signal it will be below the predetermined threshold $V_{thresh}$ and the device will output an empty signal. When an occupant is present in the seat 14 or when the electrode 34 is disconnected or damaged, the difference between the outputs of the two low pass filters will be large and the output of the differential amplifier will be a waveform centered around half-supply. Shorting the electrode 34 to the grounded chassis will also have this effect. Once the signal is converted to a DC signal, it will be above the predetermined threshold $V_{thresh}$ and the device will output an occupied signal.

Note that the AC signals for an occupied seat 14 and for a damaged electrode 34 are of opposite phases. This is because when an occupant is present, the capacitance $C_v$ increases causing the output signal coming from the sensing arm of the bridge circuit 48 to have a smaller peak-to-peak value than the output signal coming from the reference arm of the bridge circuit 48. When the electrode 34 is disconnected or damaged, the capacitance $C_v$ decreases causing the output signal coming from the sensing arm of the bridge circuit 48 to have a larger peak-to-peak value than the output signal coming from the reference arm of the bridge circuit 48. When the electrode 34 is shorted to the grounded chassis, the signal on negative input of the differential amplifier will always be much smaller than the signal on the positive input and the output of the amplifier will saturate high and will always produce a DC signal above $V_{thresh}$.

Figure 4:
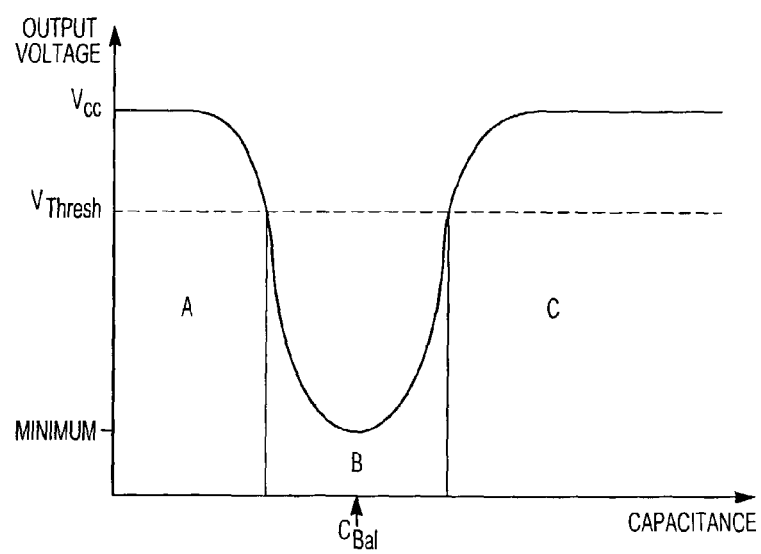
FIG. 4 is a graph of the output voltage of the AC-DC converter versus the capacitance detected on the electrode for an empty seat, an occupied seat and a disconnected or damaged electrode.

FIG. 4 shows the plot of the DC output of the differential amplifier versus the value of the virtual capacitance $C_v$ for different configurations. Region B corresponds to an empty seat and at least a fairly balanced bridge circuit 48. $C_{bal}$ indicates the point of the graph that corresponds to a perfectly balanced bridge circuit 48. Region C of the graph corresponds to an occupied seat. Region A of the graph corresponds to a disconnected or damaged electrode 34. Regions A and C in FIG. 4 both correspond to a debalanced bridge circuit 48. The circuit is tuned for a given environment as follows: The position of the MINIMUM of the curve is set by the value or the components in the bridge circuit 48 $R_{occ}$, $R_{ref}$ and $C_{ref}$. These values are tuned so that the MINIMUM point on the curve occurs at the value of $C_v$ that corresponds to and empty seat ($C_{bal}$). The sensitivity of the device to changes in the virtual capacitance $C_v$ is tuned by changing the gain of the differential amplifier and the predetermined threshold value $V_{thresh}$. $V_{thresh}$ must be situated between the MINIMUM of the curve and the saturation voltage of the differential amplifier less a diode drop.

Figure 5:
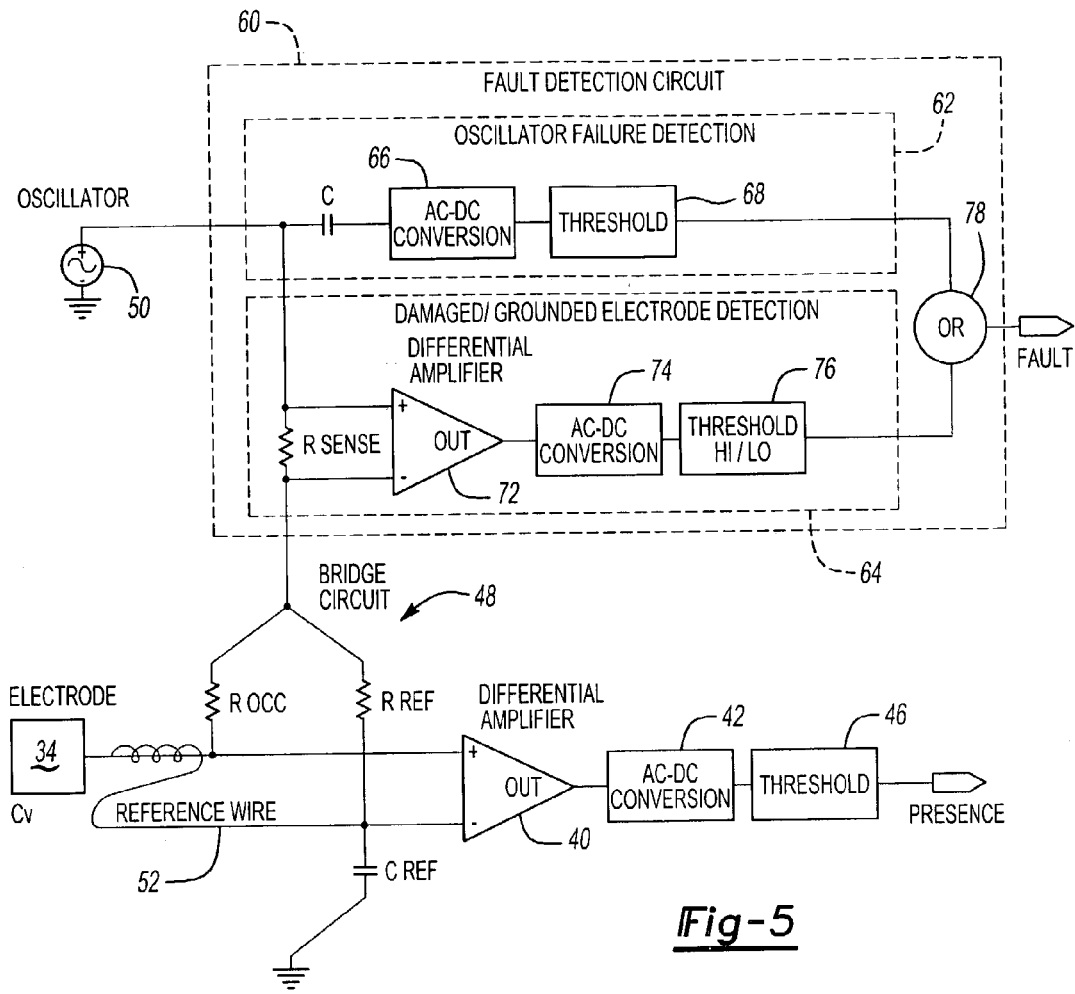
FIG. 5 shows the block diagram for the detection circuit of the second embodiment of the invention.

In the second embodiment of the invention, shown in FIG. 5, a fault detection circuit 60 is incorporated to detect the most common failure modes of a capacitance based system. These include; failure of the oscillator 50 disconnected or damaged electrode 34, and the electrode 34 being shorted to the grounded vehicle chassis. This allows for the device reading the occupant presence detection device to take alternative actions in the event of a failure. This device utilizes the electrode 34 shown in FIG. 1.

The fault detection circuit 60 is divided into two independent modules; an oscillator failure detection module 62 and a damaged/grounded electrode detection module 64. The output of the oscillator 50 is coupled to an AC-DC converter 66 via the capacitor C which only allows an alternating signal to pass. Regardless of the voltage at which the oscillator 50 fails, the signal will not be passed to the AC-DC converter 66 once there is no oscillation. This will cause the DC signal to fall below a predetermined threshold as determined by threshold circuit 68, triggering the FAULT signal to be output.

The damaged/grounded electrode detection module 64 works by measuring the voltage drop over the resistor $R_{sense}$ using a differential amplifier 72 and converting the resulting AC signal to DC. The voltage drop across $R_{sense}$ varies proportionally with the current drawn by the bridge circuit 48. A damaged or disconnected electrode 34 will draw less current than an empty seat or occupied seat. Thus, the peak voltage across $R_{sense}$ will be smaller than the peak voltage across $R_{sense}$ when the seat is empty or occupied. A grounded electrode 34 will draw more current that an empty seat or occupied seat. Thus, the peak voltage across $R_{sense}$ will be larger than the peak voltage across $R_{sense}$ when the seat is empty or occupied. Therefore, the DC signal of the AC-DC converter 74 in the damaged/grounded electrode detection module 64 must be compared with both HI and LO thresholds by threshold detection circuit 76 to detect these faults. All thresholds and waveforms in the device vary in proportion to the power supply voltage. As such, the device is tolerant to sudden changes in the supply voltage and will function over a wide range of supply voltages.

The outputs of these modules 62, 64 are coupled together using a wire OR circuit 78 to provide a generic FAULT signal. However, two individual signals could be output instead of one generic FAULT signal. It is also possible to provide three individual fault signals: oscillator failure, electrode damaged, and electrode grounded if that information is even desired. Implementation of these variations will be apparent to those skilled in the art and are considered to be within the scope of the invention.

Figure 6A:
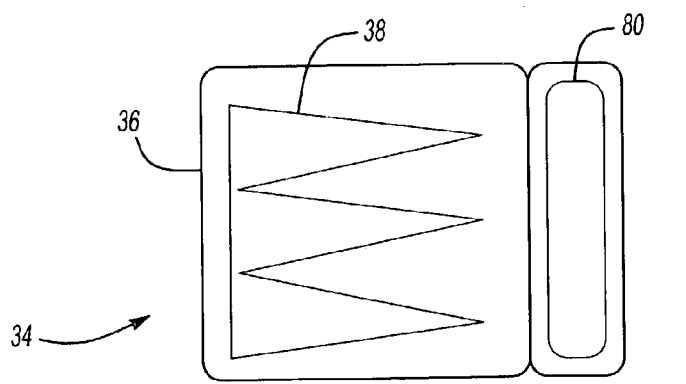
FIGS. 6a and 6b show the occupant presence detection device with child-seat detection in accordance with the third embodiment of the invention.
Figure 6B:
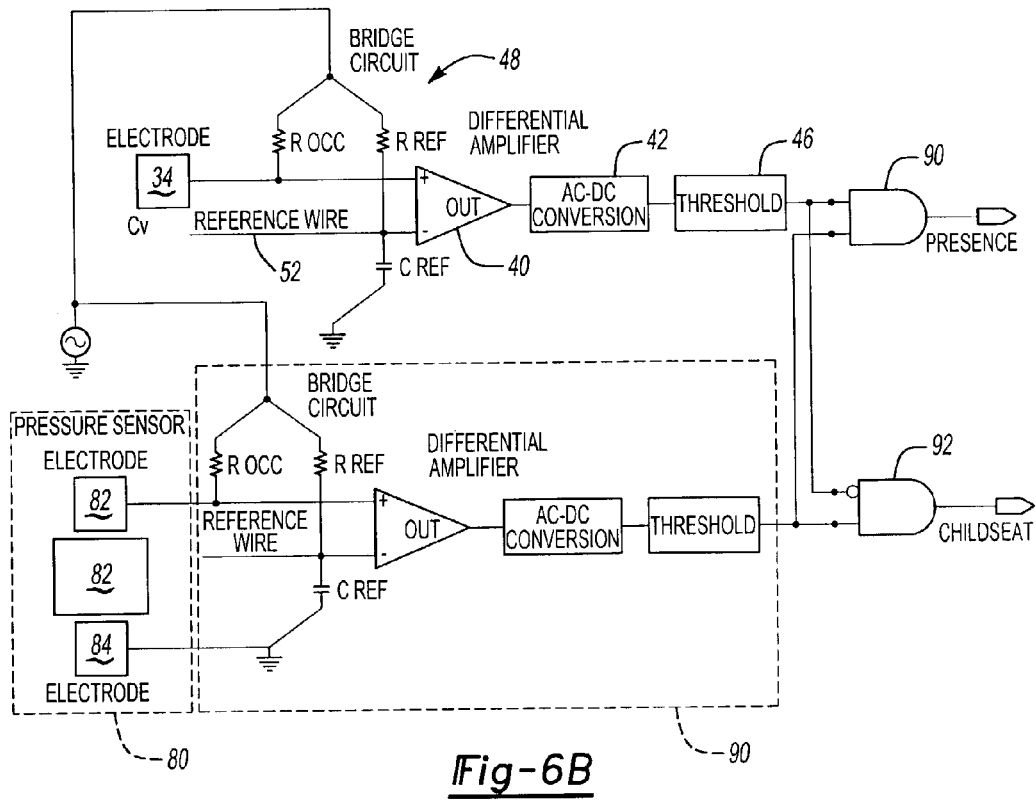

In the third embodiment of the invention, shown in FIGS. 6a and 6b, a second capacitive sensor 80, configured to detect pressure, is used in conjunction with the original electrode in order to detect the presence of a child-seat. FIG. 6a shows the TOP and SIDE view of the sensor. It consists of a basic occupant sensing electrode 34 (as described above) working in conjunction with the pressure-sensing capacitive sensor 80. The capacitive sensor 80 comprises a sensing electrode 82, a grounded plate 84 and a compressible material 86.

As mentioned previously, a decrease in the distance between the electrodes 82, 84 causes an increase in capacitance. Therefore, the weight of a body, or of a child seat will cause the distance between the sensing electrode 82 and grounded electrode 84 to decrease, causing an increase in capacitance. This will be detected by the second detection circuit 90 as shown in FIG. 6b.

The second detection circuit 90 is identical to the first, only it is configured to detect a change in pressure due to a compression force causing the material 86 between the sensing electrode 82 and the grounded electrode 84 to compress. The compressible material 86 can be made from any foam, rubber, plastic or fabric that is compressible and retains its height after being compressed. The outputs may be connected to logic circuits, such as the AND gates 90, 92 shown (with the inverted input on the child seat presence AND gate 92).

Figure 6C:
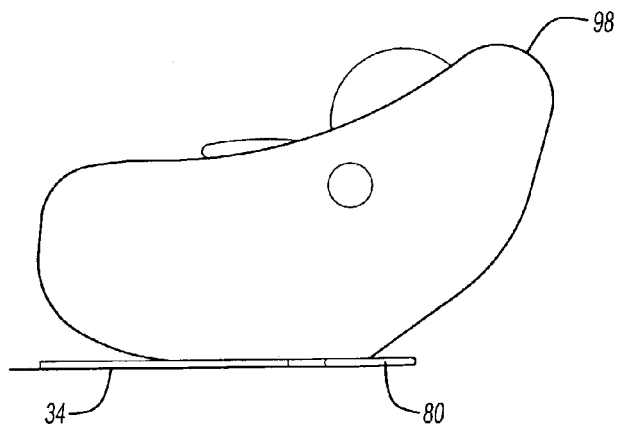
FIG. 6C shows a child-seat on top of the electrode according to the third embodiment of the invention.

FIG. 6C shows a child-seat 98 on top of the electrode according to the third embodiment of the invention. In this situation the occupant-detecting electrode 34 would not detect the child seat since it is not conductive. However, the pressure sensor 80 would detect that an object with weight above a predetermined threshold is present. This object could be something other than a child seat. In both cases, however, it would not be desirable to deploy an airbag. When the seat is empty, both outputs would indicate empty. When a seated occupant is present, both outputs would indicate a presence since an occupant is both conductive and has weight above the predetermined threshold. TABLE 1 is a summary of the operation of this embodiment.

TABLE 1

| Object in Seat | Presence Sensor Output | Child seat Sensor Output |
| --- | --- | --- |
| Empty | 0 | 0 |
| Seated Occupant | 1 | 1 |
| Child in Child seat | 0 | 1 |

Of course, it is also contemplated as part of the present invention to implement the fault detection of FIG. 5 in addition to child-seat detection of FIGS. 6a and 6b. The fault detection circuitry shown in FIG. 5 would be connected to both bridges of the device shown in FIG. 6b. This allows for the device reading the occupant presence detection device to take alternative actions in the event of a failure. This device would utilize the electrode shown in FIG. 6a.

Figure 7:
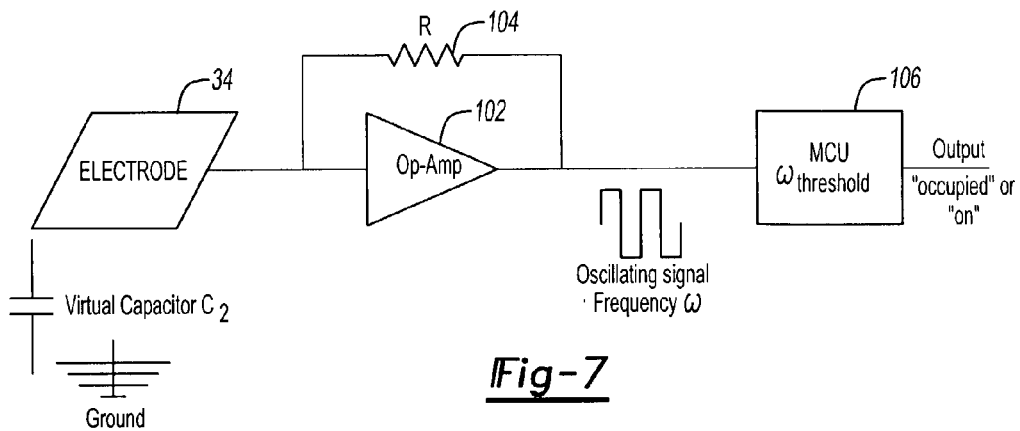
FIG. 7 shows an alternate detection circuit.

FIG. 7 shows an alternate detection circuit in which capacitance is used indirectly as the means of presence detection. The electrode 34 becomes a capacitor, C, in an oscillator circuit also including an op-amp 102 and resistor 104. The frequency at which the oscillator functions is dependent on several parameters including the capacitance C. In an empty state (no human presence) the system will oscillate at a given frequency based on these parameters so long as they remain constant. When an occupant is present, the C value increases. If, for example an RC oscillator is used, an increase in capacitance C results in a decrease in oscillating frequency. This phenomenon can be used to determine the presence of an occupant. Other oscillator configurations may have an output in which an increase in capacitance results in an increase in frequency. It should be apparent to anyone skilled in the art that this will not change the intent of the invention.

A control unit 106 is used to measure the oscillator's frequency. The control unit 106 will compare the incoming frequency to a set threshold frequency. If the incoming frequency has crossed this threshold (meaning capacitance has decreased) the control unit will output an occupied signal. If the frequency has not crossed the threshold, the control unit will output an empty signal. This threshold must be tuned based on the application of the presence detector and the surrounding environment.

This capacitance results in an oscillating frequency of $\omega_1$. The control unit is tuned so that $\omega_{threshold}$ is less than the unoccupied frequency $\omega_1$. In this configuration, the control unit 106 will output an "unoccupied" signal.

With an occupant in the seat, the occupied capacitance, C, (due to the presence of the occupant) is higher than the empty capacitance. If the resulting frequency is lower than the threshold frequency, the control unit will output an "occupied" signal.

In addition, the control unit 106 can monitor the rate of change of the oscillator's frequency. This allows the control unit 106 to ignore slow changes in frequency which would tend not to represent an occupant sitting on the seat or leaving the seat.

Figure 8:
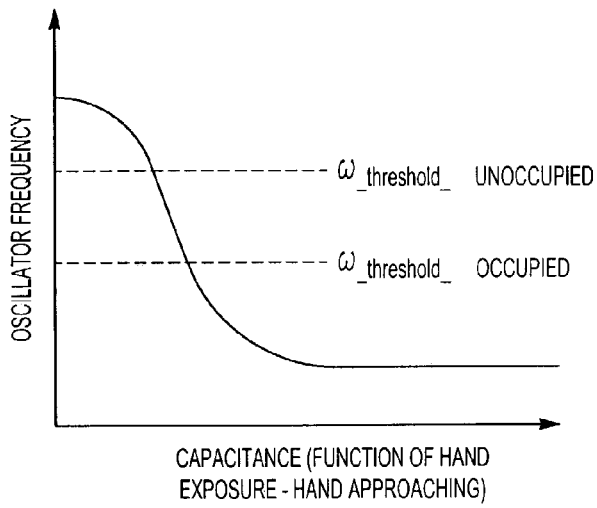
FIG. 8 is a graph of the output frequency of the detection circuit of FIG. 7 as a function of capacitance.

Hysteresis can also be added to the control unit 106 to eliminate flickering of the output signal when the frequency is hovering around the threshold. FIG. 8 shows that in the RC oscillator, the operating frequency of the oscillator must cross $\omega_{thresholdoccupied}$ in order for the circuit to output an "occupied" signal. FIG. 8 shows $\omega_{thresholdoccupied}$ is the frequency that must be crossed prior to outputting an "empty" signal. These two thresholds can be tuned in the control unit 106. Hysteresis can also be applied to the first embodiment of this invention by tuning $V_{threshold}$ in the first embodiment as $\omega_{threshold}$ is tuned in the second embodiment. When applying hysteresis to the first embodiment a similar output would be shown as in FIG. 8 with the oscillating frequency replaced by the output voltage.

Figure 9:
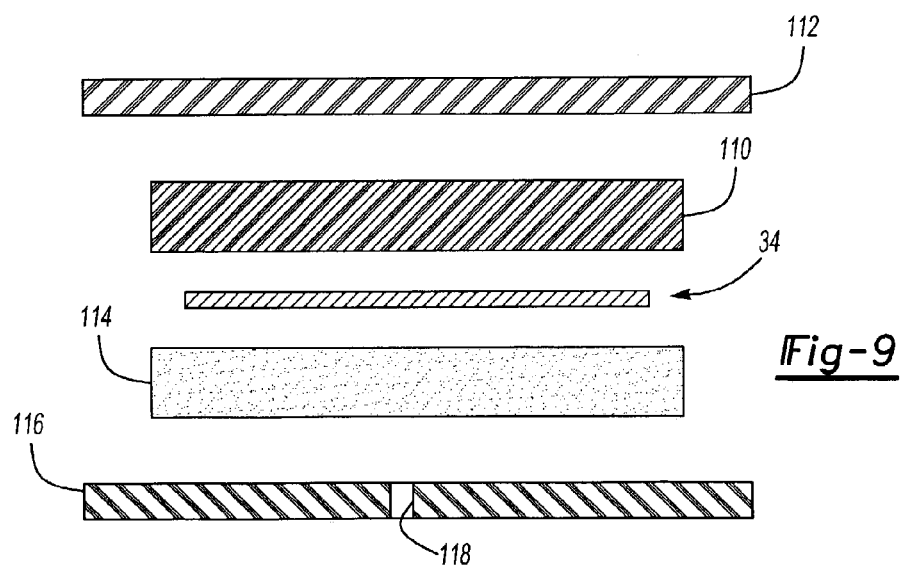
FIG. 9 shows one way for protecting the electrode in the prior figures from false detection due to moisture.

FIG. 9 illustrates one possible technique for avoiding interference from moisture with the capacitance measurement by the electrode 34. This technique is applicable to any of the embodiments described in any of the preceding Figures. An elastically deformable spacer 110, preferably comprising foam similar to that used in seats, is positioned on top of the electrode 34. The electrode 34 is then sealed against water by a seal 112, such as EPDM rubber. A second spacer 114 (again, possibly foam) and a second seal 116 (again, possibly EPDM rubber) may be positioned below the electrode 34. The spacers 110, 114 are preferably larger than the electrode 34 on all sides, preferably by about 0.5 inches. The seals 112, 116 may be coated with an adhesive on the side facing the spacer 110, 114, respectively. The seals 112, 116 are preferably larger than the spacers 110, 114 on all sides, preferably by about 1 inch, and thus adhere to the spacers 110, 114 and to one another 112, 116 at the overlapping edges. The location where the wires (not shown) exit the electrode 34 is also sealed. Adhesive may also be used between the electrode 34 and spacers 110, 114. The lower seal 116 may optionally include a hole 118 to permit air to escape to prevent ballooning.

The arrangement in FIG. 9 mitigates the effect of water on the seat because it requires the occupant to exert a force on the electrode assembly. If enough force is exerted on the upper seal 112, the spacer 110 will deform and the occupant's body will approach the electrode 34, thus changing the capacitance and the system will indicate that an occupant has been detected.

If only water is applied to the seat, there is not sufficient force to deform the spacer 110 and the spacer 110 prevents the water from approaching the electrode 34 and therefore prevents the system from falsely detecting an occupant. The arrangement of FIG. 9 could be implemented by placing the electrode 34 inside existing foam of a seat, wherein the spacers 110 and 114 would be the existing foam in the seat.

Alternatively, a moisture detector could be used in conjunction with a presence detector to notify the system when the seat is wet. When a significant amount of moisture is detected, the system could output a signal to indicate that the seat is wet and that the presence detection is currently unreliable or has been deactivated.

Again, although the present invention has been described for use in a vehicle, it would be useful in any seating application, such as those described in the Background of the Invention. Further, the present invention could also be used in non-seating applications to determine the presence of a person. It should be noted that the embodiments described above have been described for purpose of illustration and are not intended to limit the scope of the claimed invention, which is set forth in the claims. Claim terms below are intended to carry their ordinary meaning unless specifically defined otherwise in the claims. Alphanumeric identifiers on method steps are provided for ease of reference in dependent claims and are not intended to dictate a particular sequence for performance of the method steps unless otherwise indicated in the claims.

What is claimed is:

1. An occupant presence detector comprising:
   a bridge circuit including a first electrode, the bridge circuit including a sensing arm and a reference arm, the sensor arm including the first electrode, the bridge circuit being balanced when no occupant is detected near the first electrode, the bridge circuit becoming unbalanced based upon the presence of an occupant near the first electrode; and
   a differential amplifier determining when the bridge circuit is unbalanced.

2. The occupant presence detector of claim 1 further including an oscillator exciting the bridge circuit.

3. The occupant presence detector of claim 1 wherein the first electrode comprises a conductive thread.

4. The occupant presence detector of claim 3 wherein the first electrode is sewn into a vehicle seat.

5. The occupant presence detector of claim 1 wherein the first electrode comprises a conductive thread in a vehicle seat.

6. The occupant presence detector of claim 5 wherein the bridge circuit includes a sensing arm and a reference arm, the sensor arm including the first electrode.

7. The occupant presence detector of claim 6 wherein the reference arm includes a reference wire for canceling noise received by the first electrode.

8. The occupant presence detector of claim 6 wherein the sensing arm and the reference arm are inputs to the differential amplifier.

9. The occupant presence detector of claim 1 wherein the first electrode is mounted adjacent a seating surface, the detector further including a pressure sensor determining a force applied to the seating surface.

10. The occupant presence detector of claim 9 wherein the pressure sensor comprises a capacitor having a pair of spaced-apart electrodes, the space between the electrodes varying based upon the force applied to the seating surface, thereby changing a capacitance of the capacitor.

11. The occupant presence detector of claim 10 installed in a vehicle with an occupant safety system, the occupant safety system being disabled if the pressure sensor indicates that the force is less than a threshold and being enabled only if the force exceeds the threshold.

12. The occupant presence detector of claim 11 wherein the occupant safety system is disabled based upon an indication by the occupant presence detector that no occupant is present even when the pressure sensor exceeds the threshold.

13. The occupant presence detector of claim 10 wherein the pressure sensor further includes a compressible material between the pair of spaced-apart electrodes, the compressible material being compressed upon the application of force to the seating surface.

14. The occupant presence detector of claim 1 wherein the differential amplifier has a first input connected to the reference node and a second input connected to the sensor node.

15. The occupant presence detector of claim 14 further including a signal source connected to a first node in the bridge circuit, the first node connecting the reference arm and the sensor arm.

16. The occupant presence detector of claim 15 further including a first resistor between the first node and the reference node and a second resistor between the first node and the sensor node.

17. The occupant presence detector of claim 1 wherein the reference arm includes a reference wire for canceling noise received by the first electrode.

18. An occupant presence detector comprising:
   a bridge circuit including a first electrode, the bridge circuit being balanced when no occupant is detected near the first electrode, the bridge circuit becoming unbalanced based upon the presence of an occupant near the first electrode;

a differential amplifier determining when the bridge circuit is unbalanced; and a fault detection circuit monitoring the first electrode and configured to generate a fault signal based upon detection of a fault in the first electrode.

19. The occupant presence detector of claim 18 wherein the fault detection circuit monitors current through the first electrode and generates a first fault signal based upon detection of current through the first electrode exceeding a high current threshold.

20. The occupant presence detector of claim 19 wherein the fault detection circuit further generates a second fault signal based upon detection of current through the first electrode dropping below a low current threshold.

21. The occupant presence detector of claim 20 further including an oscillator exciting the bridge circuit and wherein the fault detection circuit further includes an oscillator failure detection circuit monitoring an output of the oscillator and generating an oscillator fault signal based upon detection of a failure of the oscillator.

22. An occupant presence detector comprising:

a bridge circuit including a sensing arm and a reference arm, the sensor arm including a first electrode, the reference arm including a reference wire for canceling noise received by the first electrode, wherein the reference wire is twisted with a wire in the sensing arm, the bridge circuit being balanced when no occupant is detected near the first electrode, the bridge circuit becoming unbalanced based upon the presence of an occupant near the first electrode; and a differential amplifier determining when the bridge circuit is unbalanced.

23. An occupant presence detector comprising:

an oscillating circuit including an amplifier;

an electrode forming an input to the amplifier, the capacitance of the electrode varying based upon a presence or absence of an occupant near the electrode, the frequency of the oscillating circuit changing based upon the capacitance of the electrode; and a fault detection circuit monitoring the electrode and configured to generate a fault signal based upon detection of a fault in the electrode.

24. An occupant presence detector comprising:

a bridge circuit including a first electrode, the bridge circuit being balanced when no occupant is detected near the first electrode, the bridge circuit becoming unbalanced based upon the presence of an occupant near the first electrode; and a differential amplifier determining when the bridge circuit is unbalanced, the first electrode is mounted adjacent a seating surface, the detector further including a pressure sensor determining a force applied to the seating surface wherein the occupant presence detector is installed in a vehicle with an occupant safety system, the occupant safety system being disabled if the pressure sensor indicates that the force is less than a threshold and being enabled only if the force exceeds the threshold.

25. The occupant presence detector of claim 24 wherein the occupant safety system is disabled based upon an indication by the occupant presence detector that no occupant is present even when the pressure sensor exceeds the threshold.

* * * * *